United States Patent [19]

Rafal et al.

[11] Patent Number: 4,618,996

[45] Date of Patent: Oct. 21, 1986

[54] DUAL PILOT PHASE LOCK LOOP FOR RADIO FREQUENCY TRANSMISSION

[75] Inventors: Marc D. Rafal, Durham; Larry W. Burton, Bahama; William T. Joines, Durham, all of N.C.

[73] Assignee: Avnet, Inc., New York, N.Y.

[21] Appl. No.: 603,432

[22] Filed: Apr. 24, 1984

[51] Int. Cl.⁴ .......................... H04B 1/04; H04B 1/30
[52] U.S. Cl. ........................................ 455/46; 455/71;
455/109; 455/119; 455/202; 455/260; 455/265;
370/74
[58] Field of Search ...................... 455/71, 46, 47, 4, 3,
455/265, 109, 260, 202, 203, 119; 370/74

[56] References Cited
U.S. PATENT DOCUMENTS

| | | | |
|---|---|---|---|
| 3,571,717 | 3/1971 | Monrolin | 455/202 |
| 4,165,486 | 8/1979 | Yoshisato | 455/202 |
| 4,209,748 | 6/1980 | Weber | 455/47 |

*Primary Examiner*—Marc E. Bookbinder
*Assistant Examiner*—M. Huseman
*Attorney, Agent, or Firm*—Darby & Darby

[57] ABSTRACT

A radio frequency transmission system contains at least one coherently modulated information signal, for example, a T.V. signal. At a transmission, the information signal is combined with two pilot tones, F1 and F2, related by the equation F1=N/M F2, where N and M are integers. The combined signal is suppressed-carrier modulated at microwave frequencies and transmitted to a receiver. At the receiver, the signals are demodulated by a local oscillator. The two pilot tones are then separated from the information signal and are compared to each other. The local oscillator frequency is controlled in response to this comparison such that the pilot tones at the receiver bear the same relationship to each other that they had at the transmitter. When this is achieved, the local oscillator frequency is the same as the suppressed-carrier frequency and co-channel interference is prevented.

11 Claims, 3 Drawing Figures

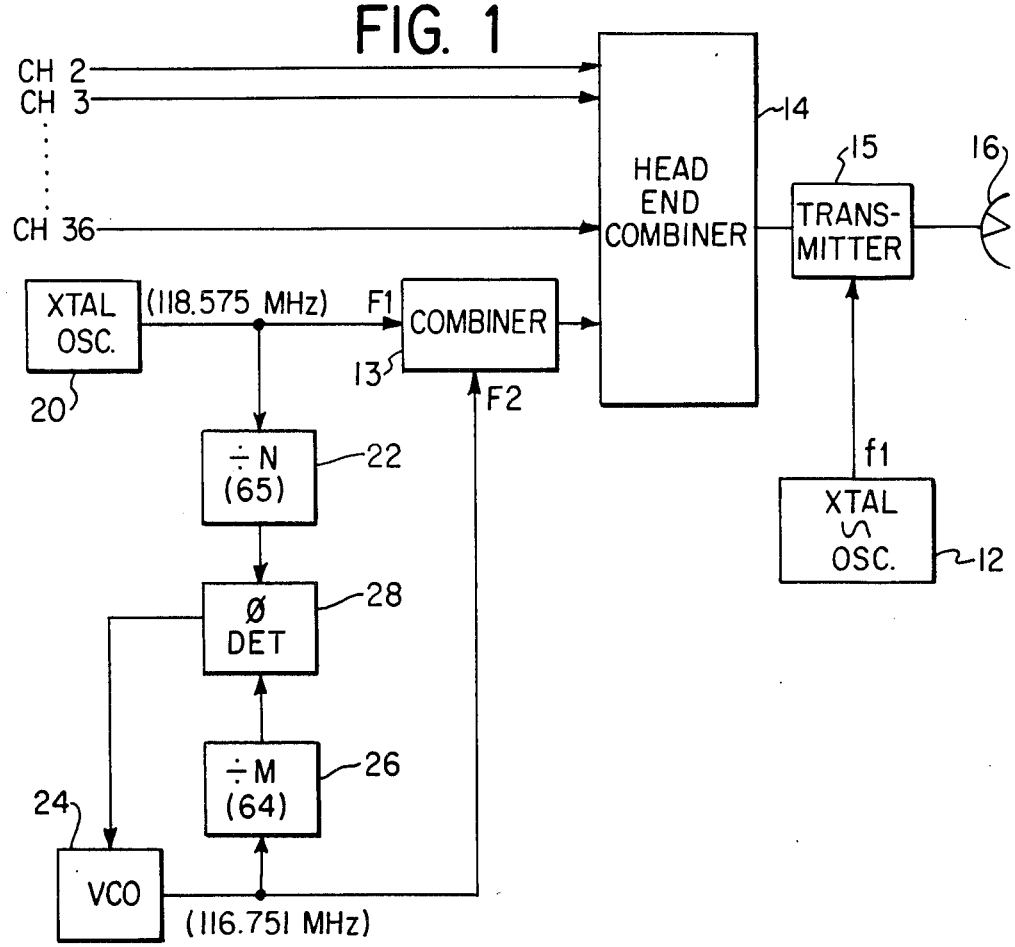
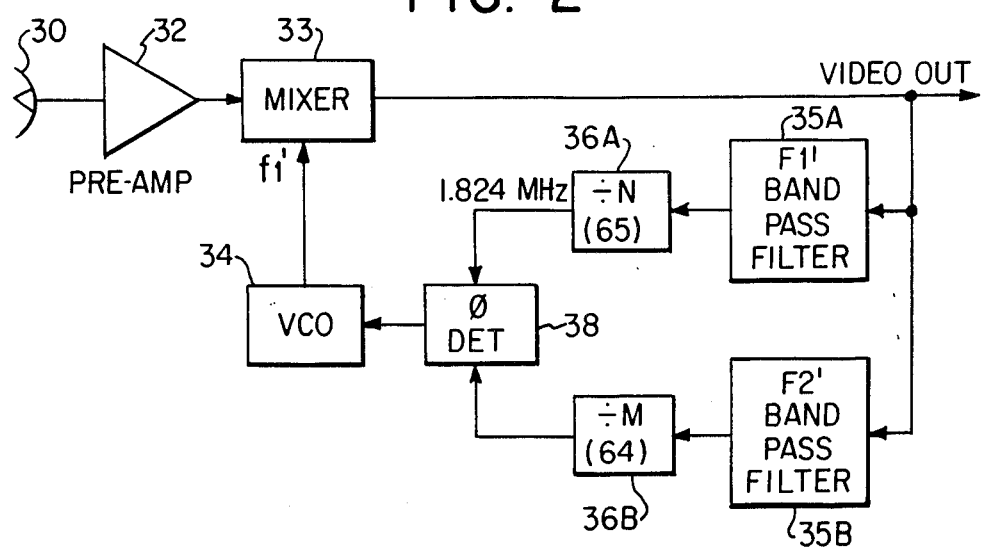

DUAL PILOT PHASE LOCK LOOP FOR RADIO FREQUENCY TRANSMISSION

BACKGROUND OF THE INVENTION

This invention relates to radio frequency transmissions and, more particularly, to a microwave relay system having the ability to achieve phase-locked operation between the transmitter and receiver by using dual related pilot tones.

In cable television systems (usually referred to as CATV systems), it is often necessary or desirable to use microwave transmission links to relay the cable signal from one cable site to another where there are subscribers to the service. It is conventional in such microwave relay systems to use single sideband modulation to reduce the band width requirements and to suppress the microwave carrier to improve the power efficiency.

Synchronous demodulation with the carrier is required at the receiver to recover the original signal. When the carrier is suppressed during transmission, the demodulation carrier must be provided by a local oscillator at the receiver. In such cases, there is inevitably some slight frequency difference between the microwave carrier at the transmitter and the locally generated microwave carrier at the receiver. This will cause the demodulated video signals at the receiver to differ slightly from their corresponding frequencies at the transmitter. When this happens, and when the video signal at the transmitter has been locked to a strong locally broadcast video signal which is also available at the subscriber's receiver, interference known as "co-channel interference" will result. One way to avoid this problem is to provide electromagnetic shielding at the subscriber's receiver. However, this is expensive if the shielding is required for all of the television sets of a CATV system. To avoid this expense, it is necessary that there be no frequency difference between the transmitted and relayed video signals. This means that the local oscillator at the receiver must be phased locked to the microwave carrier at the transmitter.

U.S. Pat. No. 3,778,716 of Stokes addresses this specific problem. Stokes provides a pilot signal which is transmitted with the television signals over the microwave link. At the receiver the pilot signal is compared to the local oscillator in a phase-locked loop that synchronizes the local oscillator frequency to the pilot frequency.

In practice, this system has serious disadvantages. Since the local oscillator and the pilot tone are compared to each other in the receiver phase-lock loop, the pilot frequency must be related to the suppressed carrier. This limits the frequencies that can be used for the pilot tone. Also, the pilot tone-local oscillator comparison is not possible if the pilot tone is not received for some reason. As a result, no local carrier will be produced and no demodulated signal will be generated for display at the receiver if the pilot signal is lost.

SUMMARY OF THE INVENTION

The present invention is directed to the elimination of co-channel interference in a suppressed carrier transmission system through the use of a phase-lock operation with two pilot tones that are transmitted with the signal.

In accordance with an illustrative embodiment of the invention, the transmitter of a microwave relay system transmits a suppressed carrier microwave signal modulated by at least one video channel. In addition, a pair of pilot tones, F1 and F2, are also transmitted to the receiver. These pilot signals are related as follows: $F1 = N/M \times F2$ where M and N are integers. The receiver includes a local oscillator which supplies the carrier for demodulation. A phase-locked loop controls this oscillator on the basis of the difference between the two pilot signals.

Because the local oscillator is controlled on the basis of the difference between the pilot tones, any convenient frequency can be selected for the pilot tones as long as they meet the required ratio criterion. Also, if the pilot signals are not received, the difference is zero so the local oscillator is still at its nominal frequency. Consequently, the signal is demodulated even if the pilot tones are not received.

BRIEF DESCRIPTION OF THE DRAWINGS

The foregoing and other features of the present invention will be more readily apparent from the following detailed description and drawings of an illustrative embodiment of the invention in which:

FIG. 1 is an illustrative embodiment of a transmitter according to the present invention;

FIG. 2 is an illustrative embodiment of a receiver according to the present invention.

DESCRIPTION OF ILLUSTRATIVE EMBODIMENTS

Figure 3:
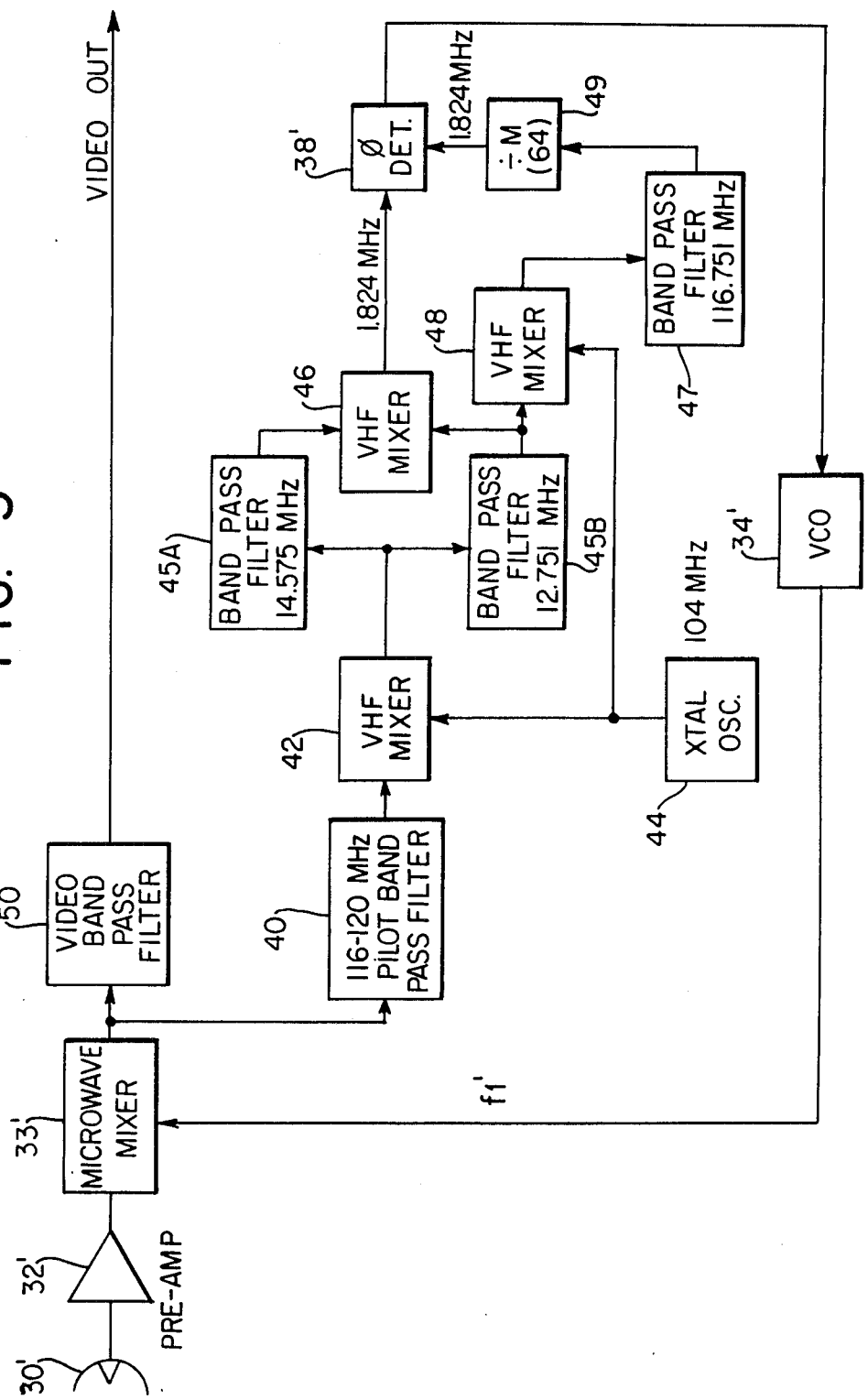
FIG. 3 is an illustrative embodiment of an alternative receiver according to the present invention.

While not limited thereto, the present invention is particularly useful in cable television systems as part of a microwave transmission link used to relay the cable signal from one cable site to another. Typically, a number of video channels are modulated onto a single microwave carrier and transmitted from a transmitter to a receiver. To conserve band width and power, single sideband, suppressed-carrier transmission is preferably used. The video signals are typically modulated onto RF carriers in the VHF spectrum. These are then converted up to microwave frequencies to be broadcasted in a point-to-point microwave link. At the receiver this microwave signal is converted back to the original VHF spectrum and is distributed via conventional cable means. The frequency spectrum used for this microwave transmission is usually from 12.7 to 13.2 GHZ, which is known as the CARS band. The VHF spectrum, however, extends from approximately 54 MHZ to 400 MHZ.

As shown in FIG. 1, a number of video channels with VHF carriers e.g. channels 2 to 36, are applied to a head end combiner 14. The video channel information from the output of combiner 14 is single sideband, suppressed-carrier modulated up to a microwave frequency $f_1$ by a microwave transmitter 15 using the output of a crystal oscillator 12. From the microwave transmitter 15 the signal is passed to an antenna 16 for transmission to a remote receiver.

This signal is transmitted without the carrier $f_1$ because of the type of transmission which is used, i.e. suppressed-carrier modulation. To ensure accurate demodulation, two pilot tones, F1 and F2, are combined with each other in combiner 13 and the result is combined with the video information in combiner 14 for transmission from antenna 16. These frequencies F1 and F2 are related to each other by the formula:

$$F1 = N/M \times F2 \qquad (1)$$

where N and M are integers. In the particular case shown in FIG. 1, F1 is selected to equal to 118.575 MHZ, N is equal to 65 and M is equal to 64. Thus, F2 is equal to 116.751 MHZ.

The signal F1 is generated from a crystal oscillator 20 whose output frequency is nominally equal to 118.575 MHZ. In addition to applying this frequency to the combiner 13, it is also provided to a divider 22 which divides the signal by 65.

The signal F2 is produced by a voltage controlled oscillator ("VCO") 24 whose output is also applied to combiner 13. Further the output of oscillator 24 is applied to a divider 26 which divides the frequency by 64. The outputs of divider 22 and divider 26 are compared in phase detector 28 and the difference signal is used to control oscillator 24 so that the signals F1 and F2 are exactly related to each other by the ratio shown in equation 1.

FIG. 2 shows a microwave receiving station with an antenna 30 for receiving microwave signals from antenna 16 of FIG. 1. The received signal is amplified in preamplifier 32 and is applied to mixer or demodulator 33. Assuming that a frequency $f_1'$ is applied from a voltage-controlled oscillator 34 to mixer 33 and that this frequency $f_1'$ is equal to the frequency $f_1$ of crystal controlled oscillator 12 in FIG. 1, the video channel information will be shifted without error down from the microwave frequency to the conventional VHF frequency band. Thus, the output of mixer 33 contains the video channel information which can be distributed over conventional cables or locally broadcast to receivers at the location of the microwave receiver.

Besides shifting the video signals down to the original frequency range, the mixer also shifts the pilot tones from the microwave frequency range back to their initial frequency range. These pilot tones F1' and F2' are separated from the rest of the video information by band pass filters 35A and 35B, respectively. The output of band pass filter 35A, i.e. signal F1' is divided by the integer N, which in this case equals 65, and similarly, the output of band pass filter 35B, i.e. signal F2', is divided by integer M, which is 64, both yielding signals with a frequency of 1.824 MHZ if f1' is equal to f1. As with the generator shown in FIG. 1, the output of the two dividers is compared in a phase detector 38 and the frequency difference is used to control the oscillator 34.

Since frequencies F1 and F2 are precisely related to each other because of the phase-locked loop which generates frequency F2 from frequency F1 in FIG. 1, they will also be related to each other in the same way in the receiver shown in FIG. 2, unless the frequency $f_1'$ differs from the frequency $f_1$. If frequency $f_1'$ does not equal frequency $f_1$, the two signals, F1 and F2, will be translated in the frequency spectrum so that their original ratio is no longer maintained. This will show up as a difference in the frequencies applied to the phase detector. In particular, at the receiver site, the down conversion translates the microwave spectrum to the base band spectrum, providing a replica of the pilot tones, i.e. F1' and F2', each offset in frequency by a translation error e in the down conversion process. If F1' and F2' are separated from each other and the base band signal, they can be processed by dividing F1' by N and F2' by M. In particular $$\frac{F1'}{N} = \frac{N}{MN} F2 + \frac{e}{N} = \frac{F2}{M} + \frac{e}{N} \qquad (2)$$

$$\frac{F2'}{M} = \frac{MF1}{NM} + \frac{e}{M} = \frac{F1}{N} + \frac{e}{M} \qquad (3)$$

If the frequency translation is exact and e=o, the output of these two division process will be exactly the same:

$$\frac{F1'}{N} = \frac{F2}{M} = \frac{M}{N} \frac{F1}{M} = \frac{F1}{N} = \frac{F2'}{M} \qquad (4)$$

Consequently the phase comparator 38 automatically adjusts oscillator 34 to the down conversion frequency needed to obtain a zero phase difference at its two inputs.

FIG. 3 shows a block diagram of an alternative reduction to practice of this scheme. In FIG. 3 elements which have the same function as those in FIG. 2 have been identified with the same reference numbers, but marked with a prime. In particular, FIG. 3 shows the microwave receiving antenna 30' coupled to a preamplifier 32'. The output of preamplifier 32' is applied to microwave mixer 33' whose output is the VHF television signals together with the two pilot tones F1' and F2'. In order to achieve the demodulation of the microwave signal, a frequency $f_1'$ from voltage-controlled oscillator 34' is applied to mixer 33'.

In the embodiment of FIG. 3 a filter 40 selects both of the pilot tones, F1' and F2', from the rest of the demodulated signal. If desired, the pilot signals can also be eliminated from the output of mixer 33' by a band pass filter 50.

The two pilot tones at the output of filter 40 are down shifted even further in a VHF mixer 42 which also receives the 104 MHZ output signal of a crystal controlled oscillator 44. By mixing the pilot tones at 118.575 MHZ and 116.751 MHZ with the 104 MHZ signal, two new difference frequencies at 14.575 MHZ and 12.751 MHZ are created. These signals are separated from each other by band pass filters 45A and 45B. By translating the pilot signals to a lower frequency range, it is easier to achieve the separation of the individual pilot tones from each other. The outputs of the band pass filters 45 are applied to a VHF mixer 46 to produce a 1.824 MHZ difference signal. The output of filter 45B is also applied to VHF mixer 48 along with the output of oscillator 44. This shifts the frequency from filter 45B back to a 116.751 frequency range at the output of VHF mixer 48. To eliminate the difference frequency in the mixer, the signal is passed through a band pass filter 47. Then the signal is divided by 64 in divider circuit 49 to produce a second 1.824 MHZ signal.

The 1.824 MHZ signal from mixer 46 is independent of translation errors since it relates only to the difference between the two pilot tones shifted to a lower frequency. However, the output of mixer 48 does contain translation errors because it is related to the lower pilot tone demodulated by the signal $f_1'$ which has been shifted down in frequency by a 104 MHZ signal and then back up by the same signal. Thus, it is independent of the 104 MHZ signal, but it is not independent of the output of oscillator 34'. In phase detector 38' the difference between the two 1.824 MHZ signals is determined and used to control oscillator 34' so that its output $f_1'$ is equal to the carrier signal $f_1$.

The circuit of FIG. 3 is relatively insensitive to drift in the 104 MHZ signal since it is used to shift the pilot frequencies together to create pseudo pilot tones and to shift the demodulated lower frequency pilot tone down to the 12.571 MHZ range and then back up to 116.751 MHZ range. There would only be a problem if the 104 MHZ signal were to drift so far that the low frequency pseudo pilot tones were outside the range of band pass filters 45A and 45B.

The use of two pilot tones in a fixed relation to each other allows the oscillator 34' in the receiver to be precisely tuned to the same frequency as the modulation oscillator 12 in the transmitter of FIG. 1. As shown in FIG. 1, the frequencies of the pilot tones, F1 and F2, are unrelated to the modulation frequency $f_1$. Thus, they can be selected for insertion at any convenient frequency where there is space for these signals. This provides a great deal of design flexibility for the system.

If the pilot tones are not received in the arrangement of FIG. 2, there will be no input to phase detector 38, no output from it and the oscillator 34 will assume its nominal value. The same is true of the receiver of FIG. 3. In this case, the 104 MHZ signal will travel through mixer 48, but will not reach to the phase detector 38' because of band pass filter 47. There will also be no 104 MHZ signal passing through filters 45A and 45B. Thus, there will be no signal received at phase detector 38' from the output of mixer 46. This means that phase detector 38' will have no inputs and will cause oscillator 34' to assume its nominal frequency.

So long as the locally generated microwave carrier is the same as the transmitter microwave carrier, the video signals produced at the receiver will be in phase with any of the remote T.V. signals which also reach the receiver area, so long as the signal transmitted over the microwave link is phase locked at the transmitter to the remote signal. As a result, there will be little or no co-channel interference due to the reception of the T.V. signal by direct broadcast and over the CATV link.

While the invention has been particularly shown and described with reference to a preferred embodiment thereof, it will be understood by those skilled in the art that various changes in form and details may be made therein without departing from the spirit and scope of the invention. In particular, it should be noted that the present invention can be used for any single sideband, suppressed-carrier modulations system, a double sideband, suppressed-carrier system or a vestigial sideband, suppressed-carrier system.

What is claimed is:

1. A radio frequency receiver for use in receiving a suppressed carrier radio frequency signal containing at least one coherently modulated information signal and two pilot signals with respective frequencies F1 and F2 related to the expression F1=N/M F2, where N and M are integers, comprising:
   means for demodulating the radio frequency signal to reproduce a coherently modulated information signal and said pilot tones, said means for demodulating including a controllable local oscillator means for producing a radio frequency signal;
   phase detector means for comparing said pilot tones to each other, said phase detector means including first and second band pass filters for separating the pilot tone with frequency F1 and the pilot tone with frequency F2, respectively, from said coherently modulated information and from each other, divider means for dividing the output of said first band pass filter by N, second divider means for dividing the output of said second band pass filter by M, and phase comparator circuit for comparing the output of the first divider with the output of the second divider to produce an error signal; and
   means responsive to the error signal of said phase detector means for controlling said local oscillator such that the frequency of said radio frequency signal from said local oscillator is locked to the frequency of said suppressed carrier signal.

2. A radio frequency receiver as claimed in claim 1 wherein said radio frequency signal is a single sideband, suppressed carrier signal.

3. A radio frequency receiver as claimed in claim 1 wherein said radio frequency signal is a double sideband, suppressed carrier signal.

4. A radio frequency receiver as claimed in claim 1 wherein said radio frequency signal is a vestigial sideband, suppressed carrier signal.

5. A radio frequency receiver as claimed in claim 1 wherein said means for demodulating includes
   a microwave mixer circuit receiving the radio frequency signal and the output of said local oscillator.

6. A radio frequency receiver for use in receiving a suppressed carrier radio frequency signal containing at least one coherently modulated information signal and two pilot signals with respective frequencies F1 and F2 related by the expression F1=N/M F2, where N and M are integers, comprising:
   means for demodulating the radio frequency signal to reproduce a coherently modulated information signal and said pilot tones, said means for demodulating including a controllable local oscillator means for producing a radio frequency signal;
   phase detector means for comparing said pilot tones to each other, said phase detector means including pilot tone band pass filter means for separating both pilot tones from said coherently modulated information signal, means for shifting the pilot tones to lower frequencies, first and second band pass filter means for separating the lower frequency pilot tones from each other, means for taking the difference between the two lower frequency pilot tones to generate a first difference signal and applying it to one input of the phase detector means, means for shifting one of the pilot tones back to its original frequency, and means for dividing the shifted pilot tone signal down to the same general value as the pilot tone difference signal and applying it to the other input of the phase detector means to create an error signal; and
   means responsive to the error signal of said phase detector means for controlling said local oscillator such that the frequency of said radio frequency signal from said local oscillator is locked to the frequency of said suppressed carrier signal.

7. A radio frequency receiver as claimed in claim 6 wherein the means for shifting the pilot tone frequencies to lower frequencies comprises a VHF mixer circuit receiving the separated pilot tones at one input and a high frequency oscillator input at the other input so as to generate the lower frequency pilot tones,
   wherein the means for taking the difference between the two lower frequency pilot tones is a second VHF mixer circuit with the two lower frequency pilot tones as inputs, and wherein the means for shifting the lower frequency pilot tone back to the higher frequency is a third VHF mixer circuit with the lower frequency pilot tone as one input and the oscillator for the first VHF mixer as the second input.

8. A radio frequency receiver as claimed in claim 6 wherein said radio frequency signal is a single sideband, suppressed carrier signal.

9. A radio frequency receiver as claimed in claim 6 wherein radio frequency signal is a double sideband, suppressed carrier signal.

10. A radio frequency receiver as claimed in claim 6 wherein said radio frequency signal is a vestigial sideband, suppressed carrier signal.

11. A radio frequency transmitter for use in producing a suppressed-carrier radio frequency signal $F_1$ containing at least one coherently modulated information signal and two pilot tones, comprising:

a crystal oscillator producing a pilot tone F1 at a frequency unrelated to the suppressed carrier $f_1$;

a controllable local oscillator producing a second frequency F2, wherein F1=N/M F2, where N and M are integers;

means for combining the outputs of the crystal oscillator and controllable local oscillator, and applying them to the suppressed carrier modulator along with the at least one coherently modulated information signal;

means for dividing the crystal oscillator signal by the integer value N;

means for dividing the controllable local oscillator signal by the integer value M; and means for comparing the divided outputs to produce a control signal controlling the local controllable oscillator.

\* \* \* \* \*